(12) United States Patent
Yoshida et al.

(10) Patent No.: US 11,830,725 B2
(45) Date of Patent: Nov. 28, 2023

(54) METHOD OF CLEANING A STRUCTURE AND METHOD OF DEPOSITING A CAPPING LAYER IN A STRUCTURE

(71) Applicant: Applied Materials, Inc., Santa Clara, CA (US)

(72) Inventors: Naomi Yoshida, Sunnyvale, CA (US); He Ren, San Jose, CA (US); Hao Jiang, San Jose, CA (US); Chenfei Shen, San Jose, CA (US); Chi-Chou Lin, San Jose, CA (US); Hao Chen, Santa Clara, CA (US); Xuesong Lu, Santa Clara, CA (US); Mehul B. Naik, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 273 days.

(21) Appl. No.: 17/153,450

(22) Filed: Jan. 20, 2021

(65) Prior Publication Data

US 2021/0233765 A1     Jul. 29, 2021

Related U.S. Application Data

(60) Provisional application No. 62/965,078, filed on Jan. 23, 2020.

(51) Int. Cl.
     *H01L 21/02*      (2006.01)
     *H01L 21/28*      (2006.01)
     (Continued)

(52) U.S. Cl.
CPC .......... *H01L 21/02057* (2013.01); *B08B 5/02* (2013.01); *H01L 21/28026* (2013.01); *H01L 21/32051* (2013.01); *H01L 29/66795* (2013.01)

(58) Field of Classification Search
CPC ......... H01L 21/02057; H01L 21/28026; H01L 21/32051; H01L 29/66795; H01L 2/02068;
(Continued)

(56) References Cited

U.S. PATENT DOCUMENTS 5,384,285 A * 1/1995 Sitaram ............. H01L 29/66575
                                                              148/DIG. 113
6,610,615 B1   8/2003   McFadden et al.
(Continued)

FOREIGN PATENT DOCUMENTS

KR      10-0931765 B1    12/2009
KR      10-1148252 B1    5/2021

OTHER PUBLICATIONS

International Search Report/Written Opinion issued to PCT/US2021/014211 dated May 17, 2021.
(Continued)

*Primary Examiner* — Didarul A Mazumder
(74) *Attorney, Agent, or Firm* — Patterson + Sheridan, LLP

(57) ABSTRACT

Embodiments of the present disclosure generally relate to methods of cleaning a structure and methods of depositing a capping layer in a structure. The method of cleaning a structure includes suppling a cleaning gas, including a first gas including nitrogen (N) and a second gas including fluorine (F), to a bottom surface of a structure. The cleaning gas removes unwanted metal oxide and etch residue from the bottom surface of the structure. The method of depositing a capping layer includes depositing the capping layer over the bottom surface of the structure. The methods described herein reduce the amount of unwanted metal oxides and residue, which improves adhesion of deposited capping layers.

20 Claims, 8 Drawing Sheets

(51) Int. Cl.
*B08B 5/02* (2006.01)
*H01L 29/66* (2006.01)
*H01L 21/3205* (2006.01)

(58) Field of Classification Search
CPC ............... H01L 21/044; H01L 21/049; H01L 21/823437; H01L 21/823828; H01L 29/4232; H01L 29/78391; H01L 29/7845; H01L 29/7856; H01L 21/0337; H01L 21/3105; H01L 21/31155; H01L 21/31116; H01L 21/823431; H01L 21/762; H01L 29/267; H01L 29/1054; H01L 21/76816; H01L 29/785; H01L 27/0886; B08B 5/02
USPC ............................................................. 438/592
See application file for complete search history.

(56) References Cited

U.S. PATENT DOCUMENTS

| | | | |
|---|---|---|---|
| 6,660,659 B1 | 12/2003 | Kraus et al. | |
| 6,798,026 B2 | 9/2004 | Hu et al. | |
| 6,831,021 B2 | 12/2004 | Chua et al. | |
| 6,887,774 B2 | 5/2005 | Hu et al. | |
| 7,122,454 B2 | 10/2006 | Olsen | |
| 7,172,792 B2 | 2/2007 | Wang et al. | |
| 7,179,754 B2 | 2/2007 | Kraus et al. | |
| 7,396,480 B2 | 7/2008 | Kao et al. | |
| 7,429,538 B2 | 9/2008 | Olsen | |
| 7,514,373 B2 | 4/2009 | Kraus et al. | |
| 7,727,828 B2 | 6/2010 | Chua et al. | |
| 7,871,942 B2 | 1/2011 | Kher et al. | |
| 7,888,217 B2 | 2/2011 | Chua et al. | |
| 7,972,933 B2 | 7/2011 | Olsen et al. | |
| 8,481,433 B2 | 7/2013 | Bevan et al. | |
| 8,546,273 B2 | 10/2013 | Bevan et al. | |
| 8,748,259 B2 | 6/2014 | Ganguly et al. | |
| 8,801,952 B1 | 8/2014 | Wang et al. | |
| 8,951,911 B2 | 2/2015 | Naik et al. | |
| 8,999,106 B2 | 4/2015 | Liu et al. | |
| 9,018,054 B2 | 4/2015 | Yoshida et al. | |
| 9,054,045 B2 | 6/2015 | Posseme et al. | |
| 9,054,048 B2 | 6/2015 | Liu et al. | |
| 9,169,556 B2 | 10/2015 | Wu et al. | |
| 9,177,787 B2 | 11/2015 | Guarini et al. | |
| 9,508,556 B1 * | 11/2016 | Tsai | H01L 29/0847 |
| 9,831,091 B2 | 11/2017 | Liu et al. | |
| 9,966,275 B2 | 5/2018 | Biggs et al. | |
| 10,049,881 B2 | 8/2018 | Rogers et al. | |
| 10,103,027 B2 | 10/2018 | Swenberg et al. | |
| 2005/0191830 A1 | 9/2005 | Collins et al. | |
| 2006/0019033 A1 | 1/2006 | Muthukrishnan et al. | |
| 2007/0049043 A1 | 3/2007 | Muthukrishnan et al. | |
| 2007/0111458 A1 | 5/2007 | Sato et al. | |
| 2010/0120245 A1 | 5/2010 | Tjandra et al. | |
| 2010/0190345 A1 * | 7/2010 | Chen | H01L 21/31116 257/E21.241 |
| 2011/0017127 A1 | 1/2011 | von Kanel et al. | |
| 2012/0061676 A1 | 3/2012 | Egi et al. | |
| 2012/0214303 A1 * | 8/2012 | Ganguli | H01L 21/0206 257/E21.296 |
| 2015/0194352 A1 | 7/2015 | Chuang et al. | |
| 2015/0372118 A1 * | 12/2015 | Zhang | H01J 37/32541 438/283 |
| 2015/0372119 A1 * | 12/2015 | Zhang | H01L 29/1033 438/268 |
| 2016/0196980 A1 | 7/2016 | Degai et al. | |
| 2016/0240385 A1 * | 8/2016 | Citla | H01L 21/02071 |
| 2017/0033109 A1 | 2/2017 | Yamazaki | |
| 2017/0125536 A1 * | 5/2017 | Chen | H01L 29/42372 |
| 2017/0243754 A1 * | 8/2017 | Tavernier | H01L 29/66795 |
| 2017/0349996 A1 | 12/2017 | Olsen | |
| 2017/0365480 A1 | 12/2017 | Swenberg et al. | |
| 2017/0365512 A1 | 12/2017 | Swenberg et al. | |
| 2018/0025901 A1 * | 1/2018 | Park | H01L 21/762 |
| 2018/0082847 A1 | 3/2018 | Liu et al. | |
| 2018/0261498 A1 * | 9/2018 | Gardner | H01L 21/762 |
| 2019/0088485 A1 | 3/2019 | Rogers et al. | |
| 2019/0157143 A1 * | 5/2019 | Swenberg | H01L 21/76843 |
| 2019/0172716 A1 * | 6/2019 | Graoui | H01L 21/3212 |
| 2021/0083072 A1 * | 3/2021 | Feng | H01L 21/3212 |

OTHER PUBLICATIONS

High-density plasma chemical vapor deposition of silicon-based dielectric films for integrated circuits—S.V. Nguyen, IBM J.of Res. & Dev. 43, 1 (1999).

The impact of substrate bias on a remote plasma sputter coating process for conformal coverage of trenches and 3D structures, H.L. Brown et al.. J. Phys. D: Appl, Phys. 48, 335303 (2015).

* cited by examiner

METHOD OF CLEANING A STRUCTURE AND METHOD OF DEPOSITING A CAPPING LAYER IN A STRUCTURE

CROSS REFERENCE TO RELATED APPLICATION

This application hereby claims priority under 35 U.S.C. § 119 to U.S. Provisional Patent Application No. 62/965,078, filed on Jan. 23, 2020, the contents are incorporated herein in their entirety.

BACKGROUND

Field

Embodiments of the present disclosure relate to a method and, more specifically, to a method of cleaning a structure and a method of depositing a capping layer in a structure.

Description of the Related Art

The transistor is a key component of most integrated circuits. Since the drive current, and therefore speed, of a transistor is proportional to the gate width of the transistor, faster transistors generally require larger gate width. Thus, there is a trade-off between transistor size and speed, and "fin" field-effect transistors (FinFETs) have been developed to address the conflicting goals of a transistor having maximum drive current and minimum size. FinFETs are characterized by a fin-shaped channel region that greatly increases the size of the transistor without significantly increasing the footprint of the transistor, and are now being applied in many integrated circuits.

Multiple patterning, etching, and polishing steps can be used in manufacturing a FinFET. For example, selective etching of a certain portion of a FinFET can be performed in order to deposit metallic, semiconducting, or insulating layer(s).

One drawback with manufacture of FinFETs in the art is that etching of materials results in unwanted residue left behind by the etchant chemistry. In addition, exposed metallic layers can oxidize, creating metal oxides, which cause undesired resistivity changes in the metallic layers. The oxidized metallic layers and residue can prevent adhesion of metallic or other overlayers. In addition, it is desired to remove the oxidized metal layers and residue without damaging the features of the structure. Also, conventional cleaning methods are often inefficient for high aspect ratio features, as the narrow width of the features inhibits the flow of cleaning chemistries.

Therefore, there is a need for manufacture of transistors that reduces residue and metal oxide formation.

SUMMARY

Embodiments disclosed herein include methods of cleaning a structure and methods of depositing a capping layer in a structure. The methods described herein reduce the amount of unwanted metal oxides and residue, which improves adhesion of deposited capping layers.

In in one embodiment, a method of cleaning a structure is provided. The structure includes a plurality of field regions, a plurality of side walls having a height, each side wall of the plurality of side walls disposed proximate a field region of the plurality of field regions, and a bottom surface having a width, the bottom surface disposed between two of the side walls of the plurality of side walls. The aspect ratio of the height to the width is about 2.0 to about 2.3. The method includes exposing the bottom surface to a cleaning gas including a first gas including nitrogen (N) and a second gas including fluorine (F).

In another embodiment, a method of cleaning a structure is provided. The structure includes a plurality of field regions, a plurality of side walls having a height, each side wall of the plurality of side walls disposed proximate a field region of the plurality of field regions, and a bottom surface having a width, the bottom surface disposed between two of the side walls of the plurality of side walls. The aspect ratio of the height to the width is about 2.0 to about 2.3. The method includes exposing the bottom surface to a preclean gas including hydrogen (H), exposing the bottom surface to a cleaning gas including a first gas including nitrogen (N) and a second gas including fluorine (F), and exposing the bottom surface to a postclean gas including hydrogen gas ($H_2$).

In yet another embodiment, a method of depositing a capping layer in a structure is provided. The structure includes a plurality of field regions, a plurality of side walls having a height, each side wall of the plurality of side walls disposed proximate a field region of the plurality of field regions, and a bottom surface having a width, the bottom surface disposed between two of the side walls of the plurality of side walls. The aspect ratio of the height to the width is about 2.0 to about 2.3. The method includes exposing the bottom surface to a preclean gas including hydrogen (H), exposing the bottom surface to a cleaning gas including a first gas including nitrogen (N) and a second gas including fluorine (F), and depositing a capping layer over the bottom surface.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to methods of cleaning a structure and methods of depositing a capping layer in a structure. The method of cleaning a structure includes suppling a cleaning gas, including a first gas including nitrogen (N) and a second gas including fluorine (F). The cleaning gas removes unwanted metal oxide and etch residue from the bottom surface of the structure. The method of depositing a capping layer includes depositing the capping layer over the bottom surface of the structure. The methods described herein reduce the amount of unwanted metal oxides and residue, which improves adhesion of deposited capping layers. The method of cleaning the bottom surface does not damage the field layers. The method of cleaning is effective for cleaning the bottom surface of structures with aspect ratios larger than about 1.0. Embodiments disclosed herein may be useful for, but are not limited to, removing residue and oxides from semiconductor structures.

As used herein, the term "about" refers to a +/−10% variation from the nominal value. It is to be understood that such a variation can be included in any value provided herein.

Figure 1:
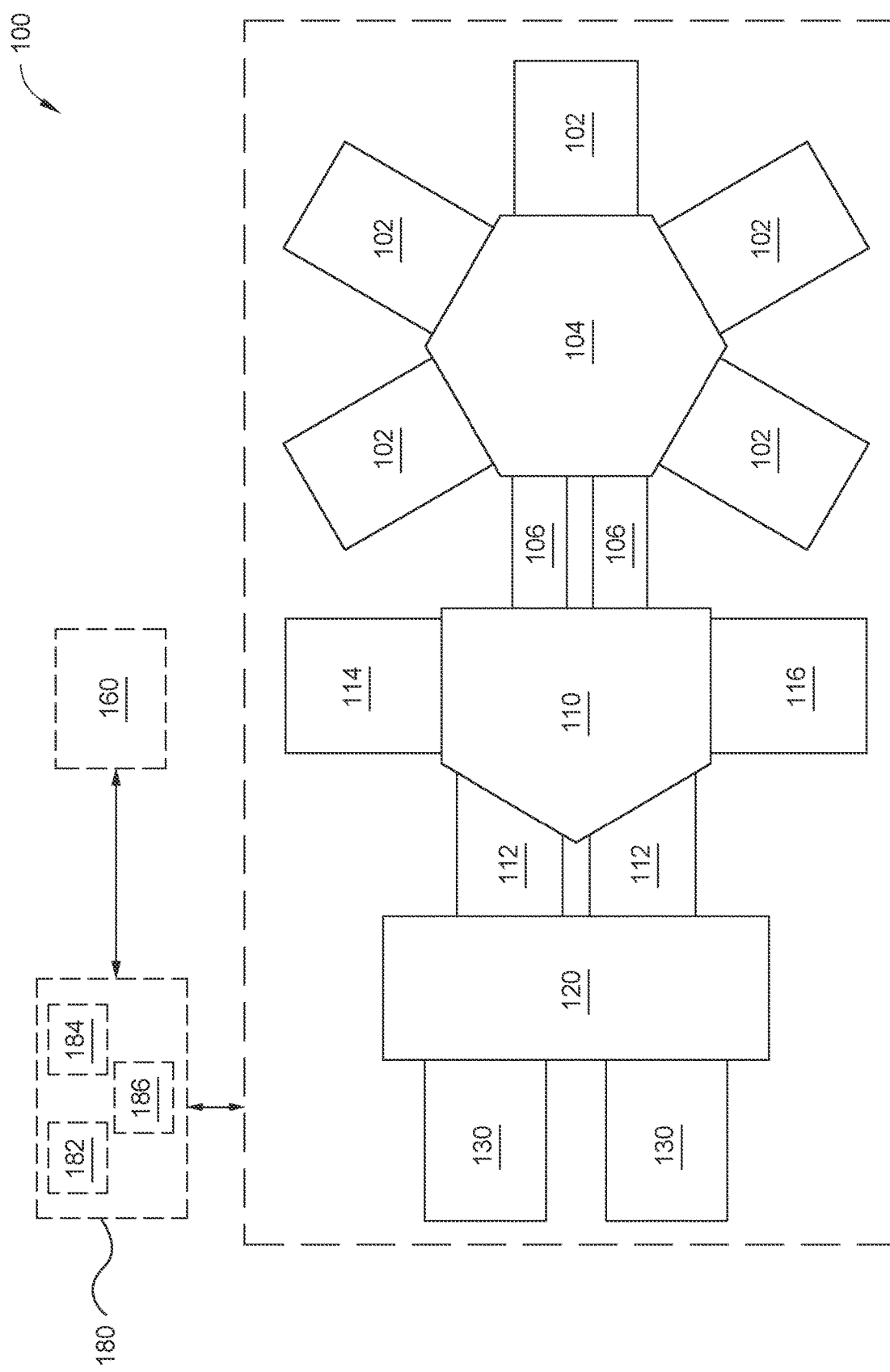
FIG. 1 illustrates a schematic top-view diagram of a multi-chamber processing system, according to one embodiment.

FIG. 1 illustrates a schematic top-view diagram of a processing system 100, according to one embodiment. The processing system 100 contains multiple chambers configured to perform a variety of semiconductor processing methods on one or more substrates. As shown, the processing system 100 includes a plurality of process chambers 102, 114, 116, transfer chambers 104, 110, pass-through chambers 106, load lock chambers 112, a factory interface 120, one or more pods 130, and a system controller 180.

Each of the process chambers 102 is coupled to the first transfer chamber 104. The first transfer chamber 104 is also coupled to the first pair of pass-through chambers 106. The first transfer chamber 104 has a centrally disposed transfer robot (not shown) for transferring substrates between the pass-through chambers 106 and the process chambers 102. The pass-through chambers 106 are coupled to the second transfer chamber 110, which is coupled to process chambers 114, 116. The second transfer chamber 110 has a centrally disposed transfer robot (not shown) for transferring substrates between the load lock chambers 112, the process chamber 114 and/or the process chamber 116, and the pass-through chambers 106. The factory interface 120 is connected to the second transfer chamber 110 by the load lock chambers 112. The factory interface 120 is coupled to the one or more pods 130 on the side opposite the load lock chambers 112. The pods 130 typically are front opening unified pods (FOUP) that are accessible from a clean room.

The process chambers 102, 114 include a coil configured to create an inductively coupled plasma, according to one embodiment. Thus, the process chambers 102, 114 are configured for plasma etching. The process chamber 116 is configured to deposit materials using any suitable deposition method, such as atomic layer deposition (ALD), chemical vapor deposition (CVD), and physical vapor deposition (PVD), according to one embodiment. Thus, the process chamber 116 is configured for material deposition.

As shown, the system controller 180 includes a central processing unit (CPU) 182, memory 184, and support circuits 186. The CPU 182 can be one of any form of a general purpose processor that is used in an industrial setting. The memory 184 can include a non-transitory computer-readable medium and/or a machine-readable storage device. The memory 184 is accessible by the CPU 182 and can be one or more of memory such as random access memory (RAM), read only memory (ROM), floppy disk, hard disk, or any other form of digital storage, local or remote. The support circuits 186 are coupled to the CPU 182 and can include cache, clock circuits, input/output subsystems, power supplies, and the like. The system controller 180 is configured to perform method 200, 400 operations stored in the memory 184.

The various embodiments disclosed in this disclosure can generally be implemented under the control of the CPU 182 by executing computer instruction code stored in the memory 184 (or in memory of a particular process chamber) as, e.g., a computer program product or software routine. That is, the computer program product is tangibly embodied on the memory 184 (or non-transitory computer-readable medium or machine-readable storage device). When the computer instruction code is executed by the CPU 182, the CPU controls the chambers to perform operations in accordance with the various embodiments.

Figure 2:
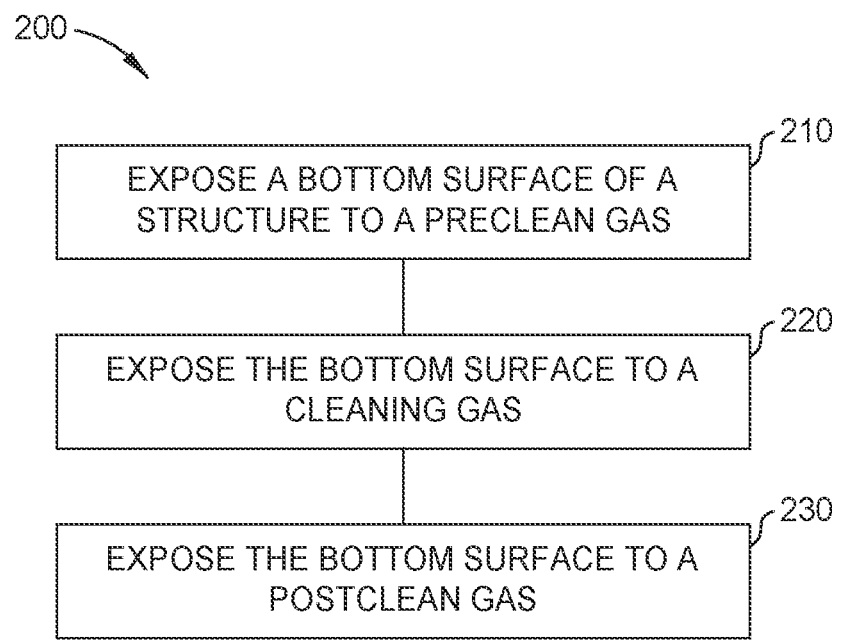
FIG. 2 is a flow diagram of method operations for cleaning a structure, according to one embodiment.

FIG. 2 is a flow diagram of method 200 operations for cleaning a structure, according to one embodiment. Although the method 200 operations are described in conjunction with FIGS. 2 and 3A-3D, persons skilled in the art will understand that any system configured to perform the method operations, in any order, falls within the scope of the embodiments described herein. The method 200 can be stored or accessible to the system controller 180 as computer readable media containing instructions, that when executed by the CPU 182 of the system controller, cause the processing system 100 to perform the method. Any of the individual operations of method 200 can be performed in any of the process chambers 102, 114, 116 of the processing system 100 described above.

Figure 3A:
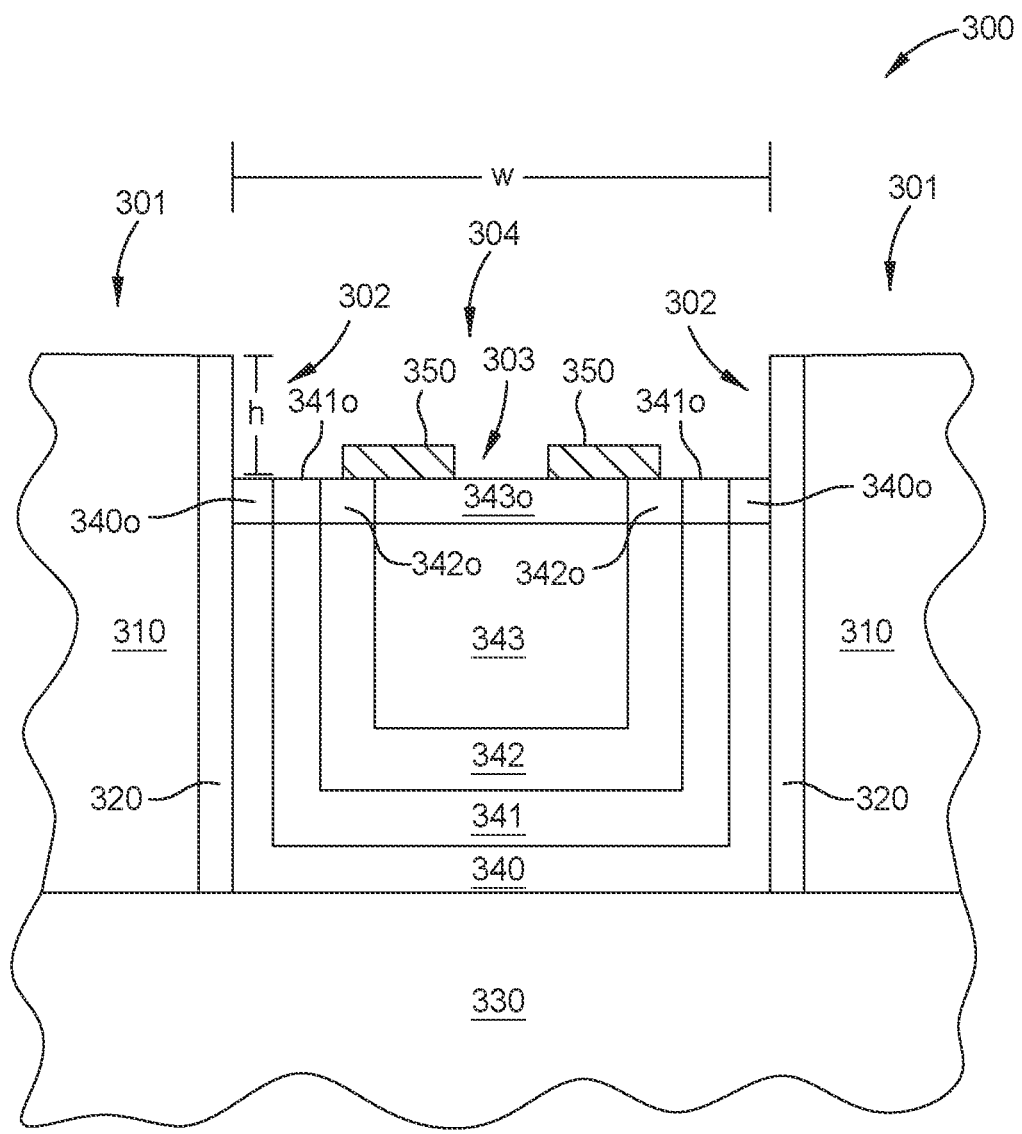
FIG. 3A illustrates a schematic view of a structure, according to one embodiment.

FIG. 3A illustrates a schematic view of a structure 300, according to one embodiment. The structure 300 is any feature used in semiconductor devices (e.g., a trench structure). The structure 300 is disposed over a substrate (not shown). As shown, the structure 300 includes a fin 330, interlayer dielectric (ILD) 310, spacers 320, and a plurality of layers 304.

The fin 330 includes a semiconducting material, such as silicon (Si) and/or germanium (Ge). The ILD 310 includes a dielectric material. The spacers 320 are disposed next to the ILD 310. The spacers 320 include a dielectric material, such as silicon nitride ($Si_3N_4$), and/or a low-k dielectric material, such as silicon oxycarbonitride ($SiO_xC_yN_z$).

As shown, the plurality of layers 304 include layers 340, 341, 342, 343. The layers 340-343 can be any combination of insulating, semiconducting, and/or metallic layers. Although four layers 340, 341, 342, 343 are shown in FIGS. 3A-3E in a particular arrangement, the disclosure is not so limiting, and any number of layers and arrangement of the layers is contemplated. The layers 340-343 can include, but are not limited to, tantalum (Ta), zirconium (Zr), niobium (Nb), hafnium (Hf), hafnium oxide ($HfO_2$), titanium nitride (TiN), titanium silicon nitride (TiSiN), tantalum nitride (TaN), titanium aluminum carbide (TiAlC), tungsten (W), tungsten carbonitride (WCN), tungsten titanium carbide (WTiC), tungsten titanium nitride (WTiN), tantalum aluminum carbide (TaAlC), tantalum silicon aluminum (TaSiAl), molybdenum nitride (MoN), molybdenum oxynitride (MoON), capping layers, high-k dielectrics, insulators, semiconductors, and/or metals.

The structure 300 includes a plurality of field regions 301, a plurality of side walls 302, and a bottom surface 303. The plurality of field regions 301 include portions of the spacers 320 and the ILD 310 disposed farthest away from the plurality of layers 304. The plurality of side walls 302 are disposed proximate to a field region of the plurality of field regions 301. The plurality of side walls 302 include portions of the spacers 320 disposed between the field regions 301 and the plurality of layers 304. The bottom surface 303 is disposed between two of the side walls of the plurality of side walls 302. The bottom surface 303 includes exposed portions of the plurality of layers 304. The plurality of side walls 302 have a height h from about 20 nm to about 40 nm, the bottom surface 303 has a width w from about 10 nm to about 30 nm, and the aspect ratio of the height to the width is about 1.0 to about 5.0, such as about 2.0 to about 2.3.

During formation of the structure 300, exposed portions of the plurality of layers 304 and the bottom surface 303 can be oxidized to create metal oxide layers 340o, 341o, 342o, 343o. For example, tungsten oxide ($WO_x$) can be formed on the surface of a W layer, and alumina ($AlO_x$) can be formed on the surface of a TiAlC layer. The metal oxide layers 340o, 341o, 342o, 343o can further include other impurities, such as boron (B), chlorine (Cl), fluorine (F), oxygen (O), and/or carbon (C). In addition, residue 350 can be formed on the bottom surface 303 during formation of the structure. The residue 350 can include any byproducts created during a recess etch. The residue 350 can include etch byproducts, such as boron (B), chlorine (Cl), fluorine (F), oxygen (O), carbon (C), metal atoms, molecules, and/or other surface contaminants.

The metal oxide layers 340o, 341o, 342o, 343o and/or residue 350 reduce adhesion of additional deposited layers on the bottom surface 303. For example, residue 350 containing more than about 4.0% Si atoms inhibits the deposition of a W capping layer. Thus, removal of the metal oxide layers 340o, 341o, 342o, 343o and/or residue 350 improve adhesion of additional deposited layers.

Figure 3B:
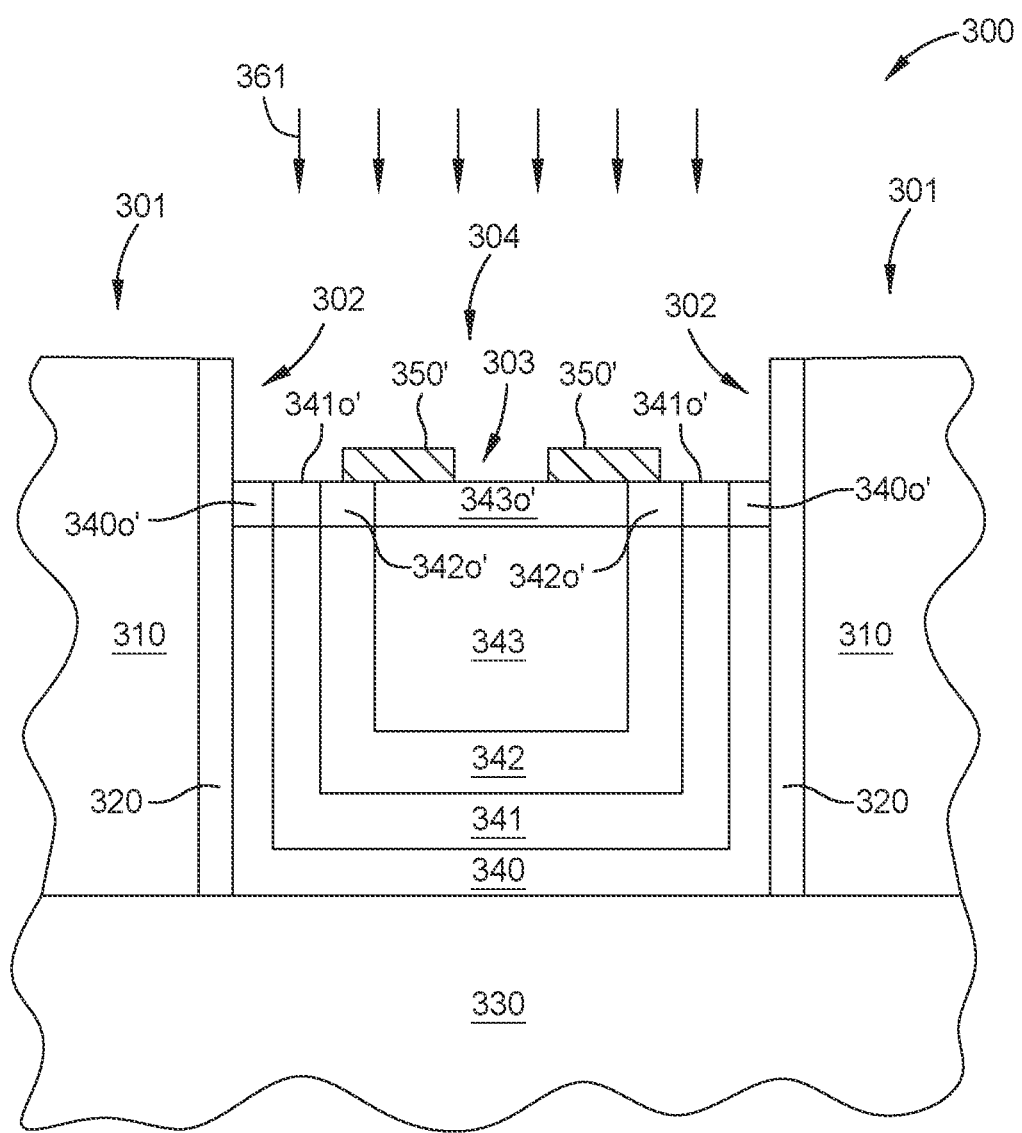
FIG. 3B illustrates a schematic view of a structure exposed to a preclean gas, according to one embodiment.

The method begins at optional operation 210, where a bottom surface (e.g., bottom surface 303) of a structure (e.g., structure 300) is exposed to a preclean gas. The preclean gas can include one or more molecular gases, plasmas, ions, radicals, or any combination of the above. FIG. 3B illustrates a schematic view of the structure 300 exposed to a preclean gas 361, according to one embodiment. The preclean gas 361 includes a hydrogen (H)-containing gas, according to one embodiment. The preclean gas 361 includes a H-containing plasma, according to one embodiment. The preclean gas 361 includes hydrogen gas ($H_2$), according to one embodiment. The preclean gas 361 chemically reacts with the metal oxide layers 340o, 341o, 342o, 343o and/or residue 350 such that the metal oxide layers and/or residue are converted to modified metal oxide layers 340o', 341o', 342o', 343o' and/or residue 350'.

The preclean gas 361 removes B-, Cl-, and/or C-containing material from the metal oxide layers 340o, 341o, 342o, 343o and/or residue 350. H atoms from the preclean gas 361 chemically react, and insert, into the metal oxide layers 340o, 341o, 342o, 343o and/or residue 350, which makes the metal oxide layers and/or residue easier to remove, according to one embodiment. Operation 210 is performed in a first process chamber, such as process chamber 102, according to one embodiment.

The preclean gas 361 includes $H_2$, according to one embodiment. The preclean gas 361 can further include a secondary gas, such as argon gas (Ar) and/or nitrogen gas ($N_2$). The ratio of the secondary gas to $H_2$ can be as large as about 500:1. The preclean gas 361 can include about 5% to about 100% $H_2$, such as about 5% to about 20% $H_2$, or about 50% to about 100% $H_2$. The pressure of the preclean gas 361 is maintained at about 1 mTorr to about 100 mTorr, such as about 5 mTorr to about 20 mTorr. The temperature of the structure 300 can be maintained from about 20° C. to about 500° C., such as from about 350° C. to about 450° C., or about 20° C. to about 200° C.

Operation 210 is performed while utilizing a plasma source, according to one embodiment. The preclean gas 361 includes an inductively coupled plasma (ICP), according to one embodiment. The ICP is created by a coil using a radio frequency (RF) of about 13.56 MHz. Plasma created by the ICP causes less damage to the field regions 301 than plasma created by other plasma sources. The plasma does not damage or otherwise undesirably strip away material from the field regions 301. The plasma selectively etches residue and/or metal oxide layers without etching the field regions 301. The source power of the coil is about 0 kW to about 3 kW, such as about 100 W to about 1 kW. The structure 300 is biased during operation 210, according to one embodiment. The frequency of the bias to the structure 300 is from about 2 MHz to about 150 MHz. The power of the applied bias to the structure 300 is about 0 W to about 500 W, such as from about 0 W to about 100 W.

The preclean gas 361, does not damage or otherwise undesirably strip away material from the field regions 301. The preclean gas 361 selectively etches the residue 350, 350', 350" and/or metal oxide layers 340o, 341o, 342o, 343o, 340o', 341o', 342o', 343o', 340o", 341o", 342o", 343o" without etching the field regions 301.

Figure 3C:
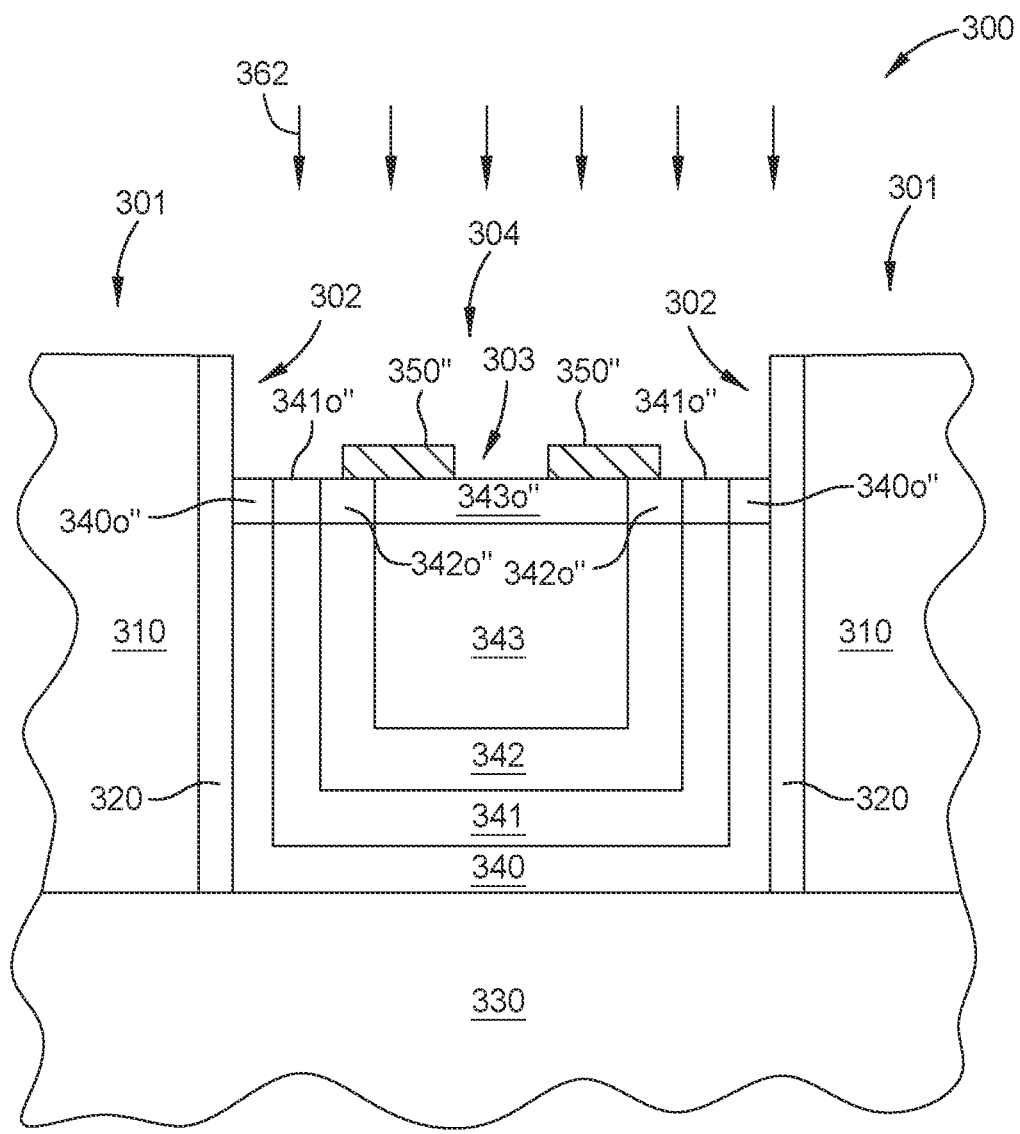
FIG. 3C illustrates a schematic view of a structure exposed to a cleaning gas, according to one embodiment.

At operation 220, the bottom surface of the structure is exposed to a cleaning gas. The cleaning gas can include one or more molecular gases, plasmas, ions, radicals, or any combination of the above. FIG. 3C illustrates a schematic view of the structure 300 exposed to a cleaning gas 362, according to one embodiment. The cleaning gas 362 includes a first gas including nitrogen (N) and a second gas including fluorine (F). The first gas includes ammonia ($NH_3$) and the second gas includes nitrogen trifluoride ($NF_3$), according to one embodiment.

The cleaning gas 362 removes B-, Cl-, C-, Si-, and/or O-containing material from the metal oxide layers 340o, 341o, 342o, 343o and/or residue 350. The cleaning gas 362 chemically reacts with the metal oxide layers 340o, 341o, 342o, 343o and/or residue 350 (or the modified metal oxide layers 340o', 341o', 342o', 343o' and/or residue 350' if optional operation 210 is performed) and the metal oxide layers and/or residue are removed. In some embodiments that include the optional operation 230 (further described below), the metal oxide layers 340o, 341o, 342o, 343o and/or residue 350 (or the modified metal oxide layers 340o', 341o', 342o', 343o' and/or residue 350' if optional operation 210 is performed) are instead converted to further modified metal oxide layers 340o", 341o", 342o", 343o" and/or residue 350". The further modified metal oxide layers 340o", 341o", 342o", 343o" and/or residue 350" are easier to remove. The cleaning gas 362 is effective in removing the metal oxide layers 340o, 341o, 342o, 343o and/or residue 350 in high aspect ratio structures 300. The cleaning gas 362, however, does not damage or otherwise undesirably strip away material from the field regions 301. The cleaning gas 362 selectively etches the residue 350, 350', 350" and/or metal oxide layers 340o, 341o, 342o, 343o, 340o', 341o', 342o', 343o', 340o", 341o", 342o", 343o" without etching the field regions 301. Operation 220 is performed in the first process chamber, such as process chamber 102, according to one embodiment.

The cleaning gas includes $NF_3$ and $NH_3$ co-flowed at a ratio of about 1:100 to about 1:1 $NF_3/NH_3$, according to one embodiment The cleaning gas 362 can further include a neutral gas to maintain pressure, such as helium gas (He) and/or argon gas (Ar). The ratio of the neutral gas to $NF_3$ and/or $NH_3$ can be as large as about 500:1. The pressure of the cleaning gas is maintained at about 1 mTorr to about 5 Torr, such as about 10 mTorr to about 1 Torr. The temperature of the structure 300 can be maintained from about −20° C. to about 150° C., such as from about 20° C. to about 100° C.

Operation 220 is performed while utilizing a plasma source, according to one embodiment. The cleaning gas 362 includes an inductively coupled plasma (ICP), according to one embodiment. The ICP is created by a coil using a radio frequency (RF) of about 13.56 MHz. As described above, plasma created by the ICP causes less damage to the field regions 301 than plasma created by other plasma sources. The source power of the coil is about 0 kW to about 3 kW, such as about 100 W to about 1 kW. The structure 300 is biased during operation 220, according to one embodiment. The power of the applied bias to the structure 300 is about 0 W to about 500 W, such as from about 0 W to about 100 W.

Figure 3D:
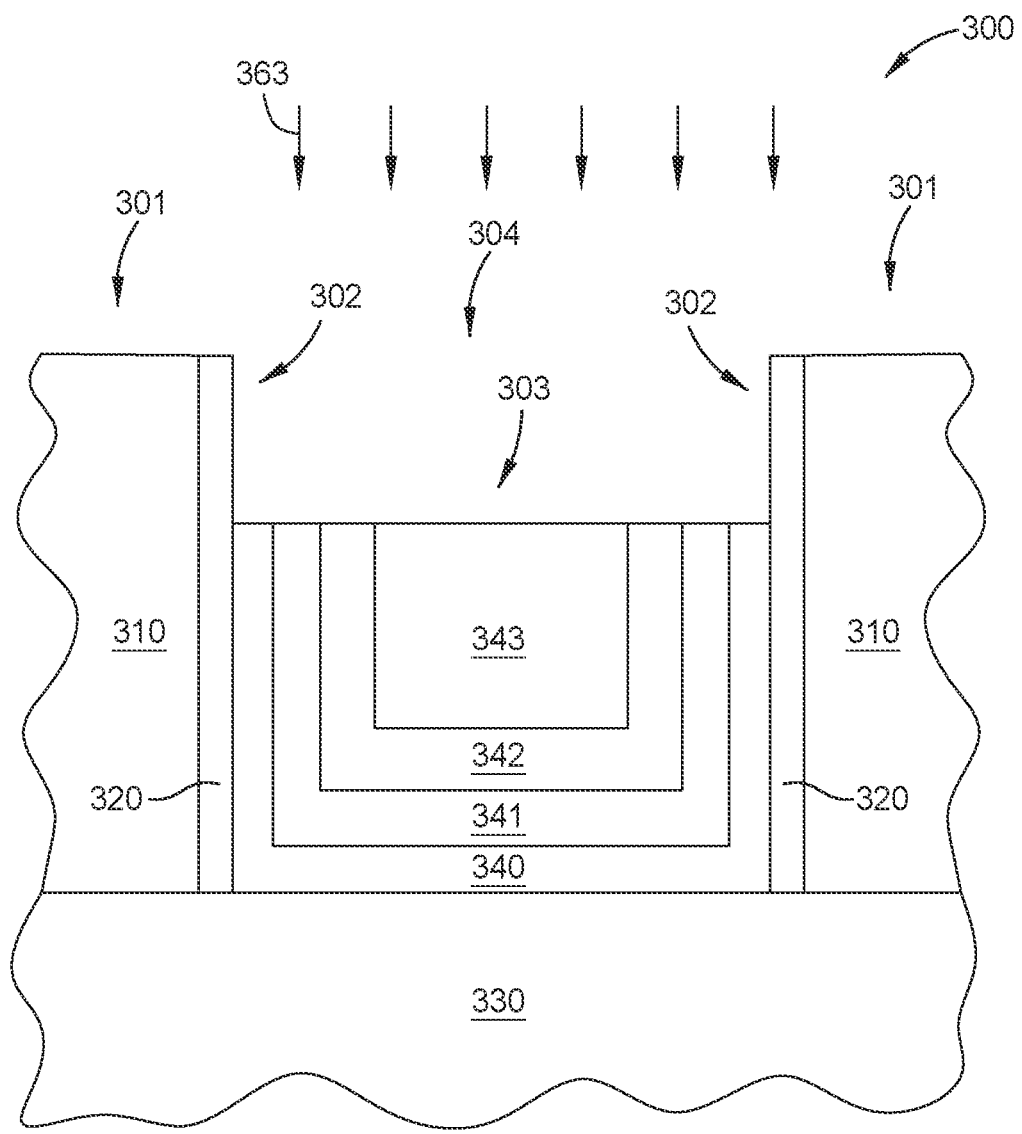
FIG. 3D illustrates a schematic view of a structure exposed to a postclean gas, according to one embodiment.

At optional operation 230, the bottom surface of the structure is exposed to a postclean gas. The postclean gas can include one or more molecular gases, plasmas, ions, radicals, or any combination of the above. FIG. 3D illustrates a schematic view of the structure 300 exposed to a postclean gas 363, according to one embodiment. Operation 230 can be included when the further modified metal oxide layers 340o", 341o", 342o", 343o" and/or residue 350" is not sufficiently removed during operation 220. The postclean gas 363 removes F-containing material from the modified metal oxide layers 340o", 341o", 342o", 343o" and/or residue 350". The postclean gas 363 includes H.

The postclean gas 363 chemically reacts with the modified metal oxide layers 340o', 341o', 342o', 343o' and/or residue 350' (or the modified metal oxide layers 340o", 341o", 342o", 343o" and/or residue 350" if optional operation 210 was performed) such that the modified metal oxide layers and/or modified residue are removed. Operation 230 is performed in a second process chamber, such as the process chamber 114 of the processing system 100, according to one embodiment.

The postclean gas 363 includes $H_2$, according to one embodiment. The postclean gas 363 can further include a secondary gas, such as argon gas (Ar) and/or nitrogen gas ($N_2$). The ratio of the secondary gas to $H_2$ can be as large as about 500:1. The postclean gas 363 can include about 5% to about 100% $H_2$, such as about 5% to about 20% $H_2$, or about 50% to about 100% $H_2$. The pressure of the postclean gas 363 is maintained at about 1 mTorr to about 100 mTorr, such as about 5 mTorr to about 20 mTorr. The temperature of the structure 300 can be maintained from about 20° C. to about 500° C., such as from about 350° C. to about 450° C., or about 20° C. to about 200° C.

Operation 230 is performed while utilizing a plasma source, according to one embodiment. The postclean gas 363 includes an inductively coupled plasma (ICP), according to one embodiment. The ICP is created by a coil using a radio frequency (RF) of about 13.56 MHz. As described above, plasma created by the ICP causes less damage to the field regions 301 than plasma created by other plasma sources. The source power of the coil is about 0 kW to about 3 kW, such as about 100 W to about 1 kW. The structure 300 is biased during operation 230, according to one embodiment. The frequency of the bias to the structure 300 is from about 2 MHz to about 150 MHz. The power of the applied bias to the structure 300 is about 0 W to about 500 W, such as from about 0 W to about 100 W.

The postclean gas 363 does not damage or otherwise undesirably strip away material from the field regions 301. The postclean gas 363 selectively etches the residue 350, 350', 350" and/or metal oxide layers 340o, 341o, 342o, 343o, 340o', 341o', 342o', 343o', 340o", 341o", 342o", 343o" without etching the field regions 301.

The method 200 reduces the amount of F atoms present in the metal oxide layer 340o, 341o, 342o, 343o by at least about 20%, according to one embodiment. The method 200 reduces the amount of O atoms present in at least one of the metal oxide layers 340o, 341o, 342o, 343o by at least about 20%, according to one embodiment. At least one of the layers 340, 341, 342, 343 includes titanium nitride (TiN), and the metal oxide layer 340o, 341o, 342o, 343o includes titanium oxynitride (TiON), according to one embodiment.

Figure 3E:
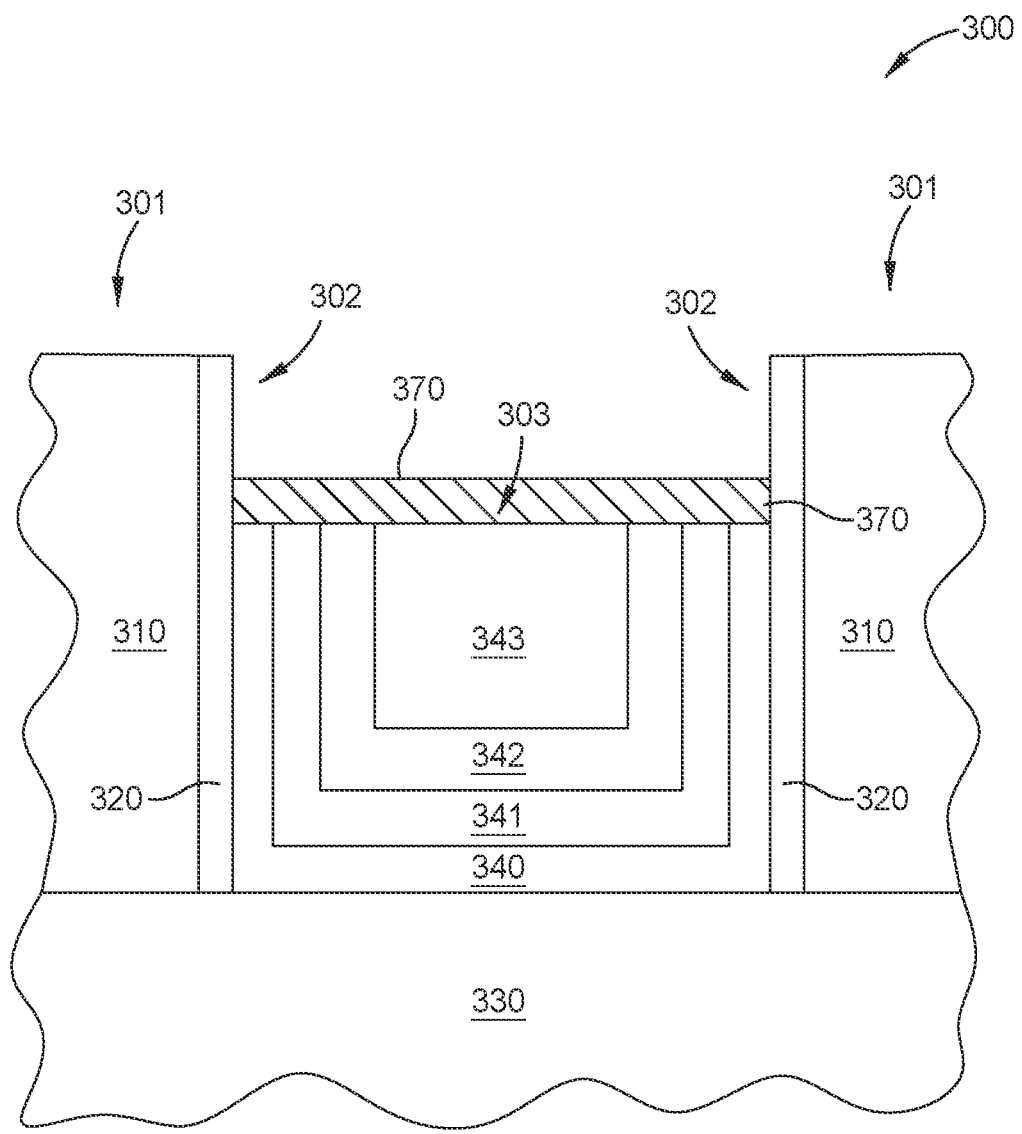
FIG. 3E illustrates a schematic view of a structure with a capping layer, according to one embodiment.
Figure 4:
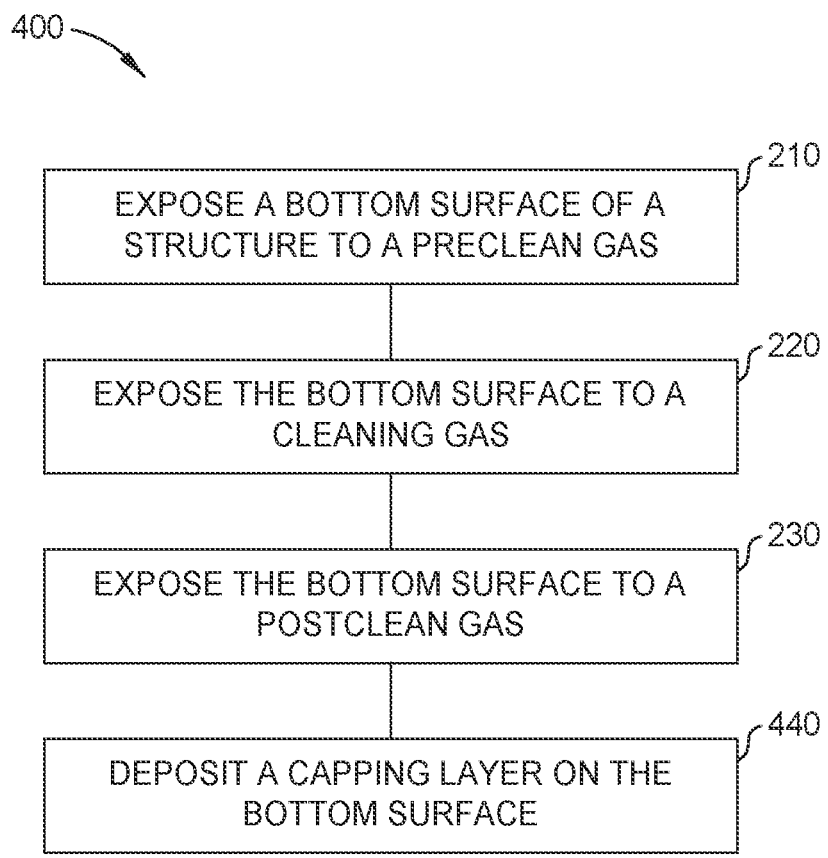
FIG. 4 is a flow diagram of method operations for depositing a capping layer in a structure, according to one embodiment.

FIG. 4 is a flow diagram of method 400 operations for depositing a capping layer in a structure, according to one embodiment. Although the method 400 operations are described in conjunction with FIGS. 4 and 3A-3E, persons skilled in the art will understand that any system configured to perform the method operations, in any order, falls within the scope of the embodiments described herein. The method 400 can be stored or accessible to the system controller 180 as computer readable media containing instructions, that when executed by the CPU 182 of the system controller, cause the processing system 100 to perform the method. Any of the individual operations of method 400 can be performed in any of the process chambers 102, 114, 116 of the processing system 100 described above.

The method begins at optional operation 210, where a bottom surface (e.g., bottom surface 303) of a structure (e.g., structure 300) is exposed to a preclean gas as described with respect to FIG. 2 and FIG. 3B.

At operation 220, the bottom surface 303 of the structure 300 is exposed to a cleaning gas as described with respect to FIG. 2 and FIG. 3C.

At optional operation 230, the bottom surface 303 of the structure 300 is exposed to a postclean gas as described with respect to FIG. 2 and FIG. 3D.

At operation 440, a capping layer is deposited on the bottom surface 303. FIG. 3E illustrates a schematic view of the structure 300 with a capping layer 370, according to one embodiment. The capping layer 370 is deposited over the bottom surface 303. The capping layer 370 can include a metal, such as W or ruthenium (Ru). The capping layer 370 reduces line resistance of the structure 300 without appreciably increasing current leakage. The capping layer 370 can have a thickness of about 5 nm to about 20 nm. The capping layer 370 can be a laminate layer and include multiple metal layers therein.

The capping layer 370 is deposited using any suitable deposition method, such as atomic layer deposition (ALD), chemical vapor deposition (CVD), and/or physical vapor deposition (PVD). The capping layer 370 is deposited using precursors including diborane ($B_2H_6$) and tungsten hexafluoride ($WF_6$) at a temperature of about 400° C. to about 500° C., according to one embodiment. The capping layer 370 is deposited using a selective deposition process, according to one embodiment. Because selective deposition efficacy depends on the chemical composition of the surface exposed for deposition (e.g., the bottom surface 303), cleaning of the surface improves the adhesion of the capping layer 370. The capping layer 370 is deposited in a third process chamber, such as the process chamber 116 of the processing system 100, according to one embodiment.

As described above, a method of cleaning a structure and a method of depositing a capping layer in a structure are provided. The method of cleaning the structure includes suppling a cleaning gas, including a first gas including N and a second gas including F. The cleaning gas removes unwanted metal oxide and etch residue from a bottom surface of the structure. The method of depositing the capping layer includes depositing the capping layer over the bottom surface of the structure.

The adhesion of the capping layer is improved by the method of cleaning the bottom surface. In addition, the method of cleaning the bottom surface does not damage the field layers. The method of cleaning is effective for cleaning the bottom surface of structures with aspect ratios larger than about 1.0.

While the foregoing is directed to embodiments of the present disclosure, other and further embodiments of the disclosure may be devised without departing from the basic scope thereof, and the scope thereof is determined by the claims that follow.

What is claimed is:

1. A method of cleaning a structure, comprising:
    forming the structure, the structure comprising:
        a plurality of field regions;
        a plurality of side walls having a height, each side wall of the plurality of side walls disposed proximate a field region of the plurality of field regions; and
        a bottom surface having a width, the bottom surface disposed between two of the side walls of the plurality of side walls, wherein an aspect ratio of the height to the width is about 2.0 to about 2.3, wherein the bottom surface comprises a metal-containing layer and a metal oxide layer; and
    exposing the bottom surface to a cleaning gas comprising a first gas comprising nitrogen (N) and a second gas comprising fluorine (F), wherein exposing the bottom surface to the cleaning gas reduces an amount of oxygen (O) atoms present in the metal oxide layer by at least about 20%.

2. The method of claim 1, wherein the first gas comprises ammonia ($NH_3$), and the second gas comprises nitrogen trifluoride ($NF_3$).

3. The method of claim 1, further comprising:
    prior to exposing the bottom surface to the first gas and the second gas, exposing the bottom surface to a preclean gas comprising hydrogen (H).

4. The method of claim 3, wherein the preclean gas comprises hydrogen gas ($H_2$).

5. The method of claim 1, further comprising:
    after exposing the bottom surface to the first gas and the second gas, exposing the bottom surface to a postclean gas comprising $H_2$.

6. The method of claim 5, wherein:
    exposing the bottom surface to the first gas and the second gas is performed in a first process chamber, and
    exposing the bottom surface to the postclean gas is performed in a second process chamber.

7. The method of claim 1, wherein:
    the metal-containing layer comprises titanium nitride (TiN), and
    the metal oxide layer comprises titanium oxynitride (TiON).

8. The method of claim 1, further comprising depositing a capping layer over the bottom surface.

9. A method of cleaning a structure, comprising:
    forming the structure, the structure comprising:
        a plurality of field regions;
        a plurality of side walls having a height, each side wall of the plurality of side walls disposed proximate a field region of the plurality of field regions; and
        a bottom surface having a width, the bottom surface disposed between two of the side walls of the plurality of side walls, wherein an aspect ratio of the height to the width is about 2.0 to about 2.3, wherein the bottom surface comprises a metal-containing layer and a metal oxide layer;
    exposing the bottom surface to a preclean gas comprising hydrogen (H);
    exposing the bottom surface to a cleaning gas comprising a first gas comprising nitrogen (N) and a second gas comprising fluorine (F), wherein the exposing the bottom surface to the cleaning gas reduces an amount of oxygen (O) atoms present in the metal oxide layer by at least about 20%; and
    exposing the bottom surface to a postclean gas comprising $H_2$.

10. The method of claim 9, wherein:
    the first gas comprises ammonia ($NH_3$),
    the second gas comprises nitrogen trifluoride ($NF_3$), and
    the preclean gas comprises hydrogen gas ($H_2$).

11. The method of claim 9, wherein:
    exposing the bottom surface to the first gas and the second gas is performed in a first process chamber, and
    exposing the bottom surface to the postclean gas is performed in a second process chamber.

12. The method of claim 9, wherein the method reduces an amount of fluorine (F) atoms present in the metal oxide layer by at least about 20%.

13. A method of depositing a capping layer in a structure, comprising:
    forming the structure, the structure comprising:
        a plurality of field regions;
        a plurality of side walls having a height, each side wall of the plurality of side walls disposed proximate a field region of the plurality of field regions; and
        a bottom surface having a width, the bottom surface disposed between two of the side walls of the plurality of side walls, wherein an aspect ratio of the height to the width is about 2.0 to about 2.3, wherein the bottom surface comprises a metal-containing layer and a metal oxide layer;
    exposing the bottom surface to a preclean gas comprising hydrogen (H);
    exposing the bottom surface to a cleaning gas comprising a first gas comprising nitrogen (N) and a second gas comprising fluorine (F), wherein the method reduces an amount of oxygen (O) atoms present in the metal oxide layer by at least about 20%; and
    depositing the capping layer over the bottom surface.

14. The method of claim 13, wherein the capping layer comprises ruthenium (Ru) or tungsten (W).

15. The method of claim 13, further comprising exposing the bottom surface to a postclean gas comprising H2.

16. The method of claim 15, wherein:
    exposing the bottom surface to the cleaning gas is performed in a first process chamber,
    exposing the bottom surface to the postclean gas is performed in a second process chamber, and depositing the capping layer is performed in a third process chamber.

17. The method of claim 16, wherein exposing the bottom surface to the preclean gas is performed in the first process chamber.

18. The method of claim 13, wherein the method reduces an amount of fluorine (F) atoms present in the metal oxide layer by at least about 20%.

19. A method of cleaning a structure, comprising:
   forming the structure, the structure comprising:
      a plurality of field regions;
      a plurality of side walls having a height, each side wall of the plurality of side walls disposed proximate a field region of the plurality of field regions; and
      a bottom surface including at least one metal oxide layer or at least one byproduct of boron (B), chlorine (CI), fluorine (F), oxygen (O), carbon (C), or a metal, the bottom surface having a width, the bottom surface disposed between two of the side walls of the plurality of side walls, wherein an aspect ratio of the height to the width is about 2.0 to about 2.3; and
   exposing the bottom surface to a cleaning gas comprising a first gas comprising nitrogen (N) and a second gas comprising fluorine (F) removes the at least one metal oxide layer or the at least one byproduct.

20. The method of claim 19, further comprising depositing a capping layer over the bottom surface.

\* \* \* \* \*